United States Patent
Park

(10) Patent No.: US 8,163,444 B2
(45) Date of Patent: Apr. 24, 2012

(54) MASK FOR CRYSTALLIZING A SEMICONDUCTOR LAYER AND METHOD OF CRYSTALLIZING A SEMICONDUCTOR LAYER USING THE SAME

(75) Inventor: Cheol-Ho Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 646 days.

(21) Appl. No.: 12/321,985

(22) Filed: Jan. 27, 2009

(65) Prior Publication Data
US 2009/0203230 A1    Aug. 13, 2009

(30) Foreign Application Priority Data
Feb. 12, 2008   (KR) .................. 10-2008-0012694

(51) Int. Cl.
*G03F 1/00* (2012.01)
*C30B 25/12* (2006.01)
(52) U.S. Cl. .................. 430/5; 117/92; 117/95
(58) Field of Classification Search .............. 430/5, 311; 117/43, 44, 92, 95
See application file for complete search history.

(56) References Cited

U.S. PATENT DOCUMENTS
2007/0184638 A1*  8/2007  Kang et al. .................. 438/487
* cited by examiner

*Primary Examiner* — Stephen Rosasco
(74) *Attorney, Agent, or Firm* — Innovation Counsel LLP

(57) ABSTRACT

A mask for crystallizing a semiconductor layer includes a plurality of first main-slit portions, a plurality of second main-slit portions, upper slit portion and lower slit portion. The first main-slit portions extend along an inclined direction with respect to a first direction. The second main-slit portions are spaced apart from the first main-slit portions. The upper slit portion is disposed on the first main-slit portions along a second direction to be parallel to the first main-slit portions, and extends partway over the second main-slit portions to be longer than the first main-slit portions. The lower slit portion is disposed under the second main-slit portions along the second direction to be parallel to the second main-slit portions, and extends partway under the first main-slit portions to be longer than the second main-slit portions.

23 Claims, 8 Drawing Sheets
(1 of 8 Drawing Sheet(s) Filed in Color)

MASK FOR CRYSTALLIZING A SEMICONDUCTOR LAYER AND METHOD OF CRYSTALLIZING A SEMICONDUCTOR LAYER USING THE SAME

CROSS-REFERENCE TO RELATED APPLICATIONS

This application claims priority under 35 U.S.C. §119 to Korean Patent Application No. 2008-12694, filed on Feb. 12, 2008 in the Korean Intellectual Property Office (KIPO), the contents of which are herein incorporated by reference in their entirety.

BACKGROUND OF THE INVENTION

1. Field of the Invention

The present invention relates to a mask for crystallizing a semiconductor layer and a method of crystallizing semiconductor layer using the mask. More particularly, the present invention relates to a mask for crystallizing a semiconductor layer used for crystallizing amorphous silicon into polycrystalline silicon, and a method of crystallizing semiconductor layer using the mask.

2. Description of the Related Art

Generally, liquid crystal display (LCD) devices employ amorphous silicon thin-film transistors (a-Si TFTs). When a high-resolution display quality is needed, LCD devices may employ polycrystalline silicon thin-film transistors (poly-Si TFTs). The poly-Si TFTs are mainly employed in organic light-emitting display devices having organic light-emitting diodes (OLED) driven by current.

In order to form polycrystalline silicon (poly-Si) thin film in a poly-Si TFT, the polycrystalline silicon thin film is formed directly on a substrate. Alternatively, an amorphous silicon thin film is first formed on a substrate, and then the amorphous silicon thin film is heated using a laser beam to form the polycrystalline silicon thin film.

In the laser beam heat processing method, the amorphous silicon thin film is melted into a liquid state when the laser beam irradiates the substrate. The melted silicon is grown, centered on a crystal nucleus, to be rearranged into a plurality of grain shapes having superior crystalline properties. The amorphous silicon thin film is thereby converted into a polycrystalline silicon thin film having higher electrical mobility than the amorphous silicon thin film.

Although the laser beam may directly irradiate the substrate; the laser beam may irradiate the substrate through a mask. Here, the mask may include a plurality of slit portions arranged in two rows to transmit the laser beam.

As the substrate is moved with respect to the mask, the laser beam is transmitted through the mask to intermittently irradiate the substrate. Here, the laser beam-transmitting slit portions induces a side growth of amorphous silicon of the substrate, so that the amorphous silicon is crystallized into polycrystalline silicon. One method of crystallizing the amorphous silicon into polycrystalline silicon is sequential lateral solidification (SLS), which uses a technique of excimer laser annealing.

However, this method of crystallizing the amorphous silicon into polycrystalline silicon by the SLS technology forms a boundary surface between the polycrystalline silicon or a protrusion in the direction of the substrate's movement. When the boundary or the protrusion is formed along the direction of the substrate's movement, electrical characteristics of the poly-Si TFT may be decreased due to the boundary surface or protrusion.

SUMMARY OF THE INVENTION

The present invention provides a mask for crystallizing a semiconductor layer. Using the mask may enhance the electrical characteristics of the semiconductor layer by forming a boundary surface between polycrystalline silicon to be inclined with respect to a direction of substrate movement.

The present invention also provides a method for crystallizing a semiconductor layer using the above-mentioned mask.

In an exemplary embodiment, a mask for crystallizing a semiconductor layer includes a plurality of first main-slit portions, a plurality of second main-slit portions, at least one upper slit portion and at least one lower slit portion.

The first main-slit portions extend along an inclined direction with respect to a first direction. The first main-slit portions are disposed substantially parallel to one another and along a second direction substantially perpendicular to the first direction. The second main-slit portions are spaced apart from the first main-slit portions in the first direction. The second main-slit portions extend along the inclined direction with the same length as the first main-slit portions and disposed substantially parallel to one another along the second direction. The at least one upper slit portion is disposed substantially parallel to and above the first main-slit portions along the second direction, and in parallel with the first main-slit portions. The upper slit portions extend toward the second main-slit portions to be longer than the first main-slit portions. The at least one lower slit portion is disposed substantially parallel to and under the second main-slit portions along the second direction. The lower slit portions extend toward the first main-slit portions to be longer than the second main-slit portions.

In an exemplary embodiment, the number of upper slit portions may be greater than the number of lower slit portions. For one example, the number of upper slit portions may be two more than the number of lower slit portions. For another example, the number of the upper slit portions may be substantially proportional to an angle between the first direction and the inclined direction. When the angle between the first direction and the inclined direction is 2N (wherein 'N' is a natural number) degrees, the number of the upper slit portions may be 3N. An angle between the first direction and the inclined direction may have a range of about 0.1 degrees to about 30 degrees.

In an exemplary embodiment, the number of lower slit portions may be greater than that the number of upper slit portions. For example, the number of lower slit portions may be two more than the number of lower slit portions. The number of the upper slit portions may be substantially proportional to an angle between the first direction and the inclined direction. When the angle between the first direction and the inclined direction is 2N (wherein 'N' is a natural number) degrees, the number of the upper slit portions may be 3N. An angle between the first direction and the inclined direction may have a range of about 0.1 degrees to about 30 degrees.

In an exemplary embodiment, a length of the upper slit portion may be substantially equal to that of the lower slit portions. The upper slit portion may extend about 50 μm to about 100 μm further than the first main slit portions. The upper slit portion may extend about 8% to about 12% further than the first main slit portion, as compared with a length of the first main-slit portions.

In an exemplary embodiment, the second main-slit portions may be disposed at a position corresponding to a center between the first main-slit portions. An extension of each imaginary center line of the second main-slit portions may be disposed between the adjacent at least two first main-slit portions.

In an exemplary embodiment, the number of the first main-slit portions may be equal to the number of the second main-slit portions. The first main-slit portions, the second main-slit portions, the upper slit portion(s) and the lower slit portion(s) may have an equal width substantially equal with each other. An interval distance between the first main-slit portions, an interval distance between the second main-slit portions, an interval distance between a slit portion disposed at the uppermost side of the first main-slit portion and the upper slit portion, and an interval distance between a slit portion disposed at the lowermost side of the second main-slit portion and the lower slit portion may be substantially equal.

In an exemplary embodiment, a method of crystallizing a semiconductor layer comprises a mask for crystallizing a semiconductor layer is disposed on a substrate having a semiconductor layer formed thereon. Then, a laser beam irradiates a first area of the substrate through the mask to enhance crystallinity of a portion of the semiconductor layer, by intermittently moving the mask along the first direction with respect to the substrate and irradiating the substrate through the mask at successive positions of the first area. Then, the mask is moved along the second direction with respect to the substrate. The laser beam then irradiates a second area of the substrate through the mask to enhance crystallinity of a portion of the semiconductor layer, by intermittently moving the mask along an inversion direction of the first direction and irradiating the substrate through the mask at successive positions of the second area.

The mask may include a plurality of first main-slit portions, a plurality of second main-slit portions, at least one upper slit portion and at least one lower slit portion.

The first main-slit portions may extend along an inclined direction with respect to a first direction. The first main-slit portions may be disposed substantially parallel to one another and along a second direction substantially perpendicular to the first direction. The second main-slit portions are spaced apart from the first main-slit portions in the first direction. The second main-slit portions may extend along the inclined direction with the same length as the first main-slit portions and disposed substantially parallel to one another and along the second direction. The at least one upper slit portion may be disposed substantially parallel to and above the first main-slit portions along the second direction. The upper slit portions may extend toward the second main-slit portions to be longer than the first main-slit portions. The at least one lower slit portion may be disposed substantially parallel to and under the second main-slit portions along the second direction. The lower slit portions extend toward the first main-slit portions to be longer than the second main-slit portions.

For example, a width of an overlapping area between the first and second areas may have a range of 3 μm to about 8 μm. Alternatively, when the number of the upper portions is different from that of the lower slit portions, the first and second areas may be connected and may not be overlapped with each other.

Moreover, an overlapping width between irradiation areas of the laser beams that is irradiated by intermittently moving the mask along the first direction has a range of about 1 μm to about 100 μm.

In an exemplary embodiment, as slit portions of a mask for crystallizing a semiconductor layer are formed to be inclined with respect to a moving direction of a substrate, a boundary surface between the polycrystalline silicon is formed to be inclined with respect to the moving direction of the substrate, so that electrical characteristics of the polycrystalline silicon TFT may be enhanced. Furthermore, the upper slit portion is extended longer than the first main-slit portion toward the second main-slit portion, and the lower slit portion is extended longer than the second main-slit portion toward the first main-slit portion, and thus a width of an overlapping area between first and second scanning areas of a laser beam may be decreased.

In an exemplary embodiment, a mask for crystallizing a semiconductor layer includes a plurality of main slit portions and at least one of extended slit potion. The main slit portions are disposed in parallel with each other. The extended slit portion has a longer length than that of the main slit portions. The extended slit portion is disposed in parallel with the main slit portions. Here, an imaginary line connecting a plurality of end portions of the main slit portions is not met with an imaginary line connecting a plurality of end portions of the upper slit potions.

In an exemplary embodiment, the extended slit portion may be formed on at least one of an upper portion of the main slit portion and a lower portion of the main slit portion, when viewed on a plan view. The main and the extended slit portions may be inclined along an inclined direction with respect to a first direction in parallel with an edge portion of the mask. For example, the number of the extended slit portion formed on the upper portion of the main slit portion may be greater than the number of the extended slit portion formed below the lower portion of the main slit portion. For example, the number of the extended slit portion may be substantially proportional to an angle between the first direction and the inclined direction. For example, the number of the upper slit portions may be 3N (wherein 'N' is a natural number) and the angle between the first direction and the inclined direction may be 2N degrees.

In an exemplary embodiment, the extended slit portion may have a longer length than that of the main slit portions about 8% to about 12%.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other advantages of the present invention will become readily apparent by reference to the following detailed description when considered in conjunction with the accompanying drawings wherein.

DESCRIPTION OF THE EMBODIMENTS

Figure 1:
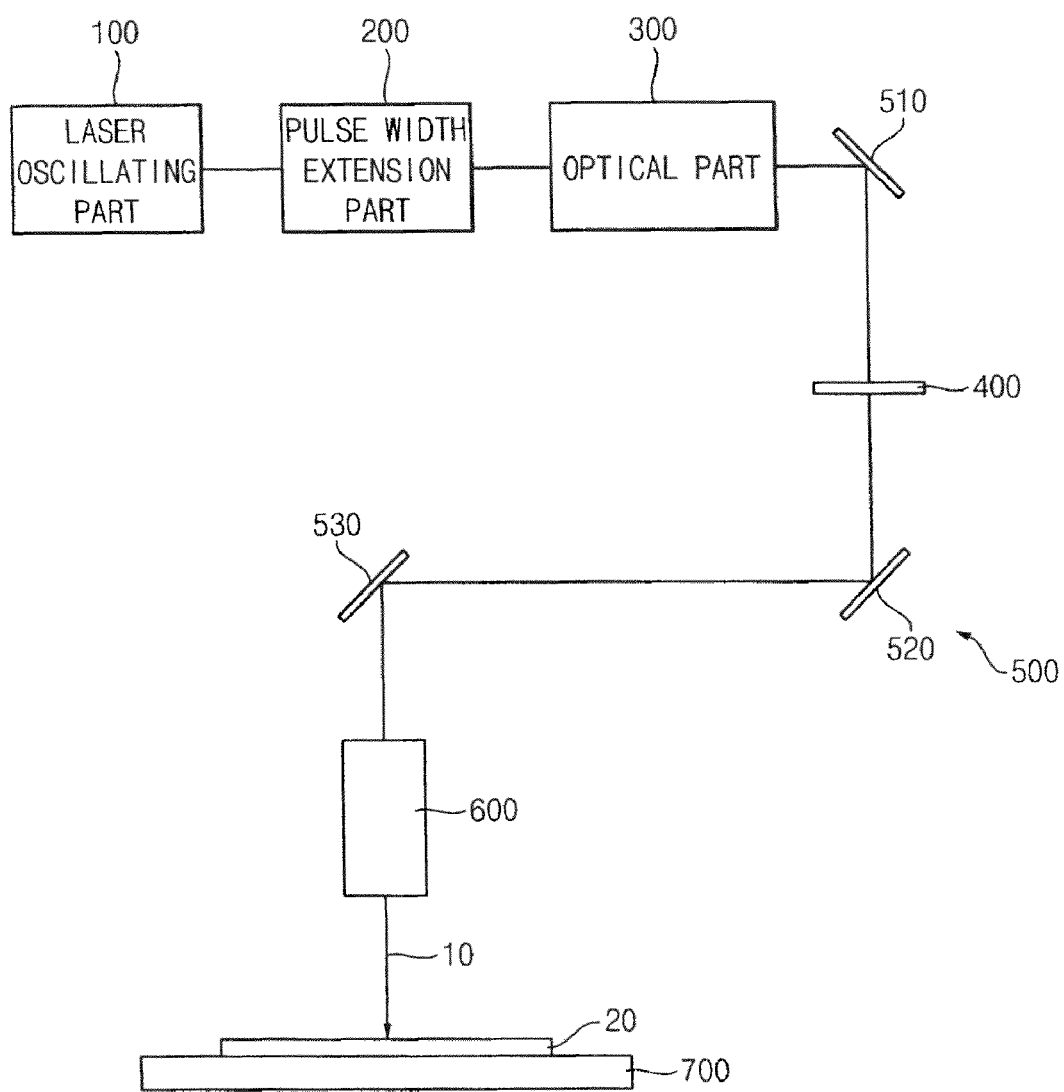
FIG. 1 is a schematic diagram illustrating a semiconductor layer crystallization apparatus according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a schematic diagram illustrating an exemplary embodiment of a semiconductor layer crystallization apparatus.

Referring to FIG. 1, an exemplary embodiment of a semiconductor layer crystallization apparatus includes a laser oscillating part 100, a pulse width extension part 200, an optical part 300, a mask for crystallizing a semiconductor layer 400, a beam-reflecting part 500, a beam-transmitting part 600 and a transferring means 700.

The laser oscillating part 100 generates a laser beam 10 continuously or intermittently. For example, the laser oscillating part 100 may be an excimer laser capable of generating a laser beam 10 of a short wavelength, high output and high efficiency.

A wavelength of the laser beam 10 generated by the excimer laser may have a range of about 300 nm to about 310 nm. Preferably, the wave length of the laser beam 10 may be about 308 nm. A frequency of the laser beam 10 may have a range of about 300 Hz to about 6,000 Hz. Preferably, the frequency of the laser beam 10 may be about 300 Hz. When the laser beam 10 has a frequency of about 300 Hz, a pulse of the laser beam 10 is repeated at intervals of about 3.33 ms. A pulse width of the laser beam 10 may be, for example, about 25 ns.

The pulse width extension part 200 is adjacent to the laser oscillating part 100 to extend a pulse width of the laser beam 10 generated from the laser oscillating part 100. The pulse width extension part 200 may extend a pulse width of the laser beam by 10 times, for example, from about 25 ns of a pulse width to about 250 ns of a pulse width. When a pulse width of the laser beam 10 is extended by 10 times, amplitude of an energy density of the laser beam 10 may be decreased by about 10% to about 50%.

The pulse width extension part 200 may include, for example, a plurality of optical plates that transmit and reflect the laser beam 10. The optical plate may delay the transmitted laser beam 10 and the reflected laser beam 10 for a predetermined time, and then may mix the delayed laser beams. Thus, a pulse width of the laser beam 10 may be extended.

The beam uniform optical part 300 may be coupled to the pulse extension part 200 to make a distribution of an energy density uniform in accordance with a position of the laser beam 10 irradiated from the pulse width extension part 200. Generally, an energy density of one pulse of the laser beam 10 may have a Gaussian distribution, so that the beam uniform optical part 300 may convert an energy density having the Gaussian distribution into an energy density having uniform distribution such as a square wave.

The beam uniform optical part 300 may include a plurality of division lenses dividing the laser beam 10 into a plurality of sub-laser beams. Each of the division lenses divides the laser beam 10 to generate a plurality of sub-laser beams, and mixes the sub-laser beams with each other to provide a uniform energy density distribution.

The mask 400 may transmit one portion of the laser beam 10 irradiated from the beam uniform optical part 300 and intercept another portion of the laser beam 10. The portion of the laser beam 10 transmitted through the mask 400 may irradiate the substrate 20 having a semiconductor layer formed thereon. The semiconductor layer irradiated by a portion of the laser beam 10 has an enhanced crystallization to be converted to polycrystalline silicon. Here, the semiconductor layer may have amorphous silicon (a-Si), microcrystalline silicon (μc-Si), polycrystalline silicon (poly-Si), etc. In this embodiment, the semiconductor layer may be amorphous silicon (a-Si).

The beam-reflecting part 500 may convert a path of the laser beam 10. The beam-reflecting part 500 may include, for example, a first reflecting mirror 510, a second reflecting mirror 520 and a third reflecting mirror 530.

The first reflecting mirror 510 is disposed between the beam uniform optical part 300 and the mask 400. The first reflecting mirror 510 reflects the laser beam 10 irradiated from the beam uniform optical part 300 so that the reflected laser beam 10 is incident on the mask 400.

The second reflecting mirror 520 may be disposed below the mask 400. The second reflecting mirror 520 reflects the laser beam 10 transmitted through the mask 400 to the third reflecting mirror 530.

The third reflecting mirror 530 may be spaced apart from the second reflecting mirror 520 to reflect the laser beam 10 reflected by the second reflecting mirror 520 to the beam-transmitting part 600. For example, a plurality of lenses (not shown) and a plurality of mirrors (not shown) may be disposed between the second reflecting mirror 520 and the third reflecting mirror 530 so as to enhance optical characteristics of the laser beam 10.

The beam-transmitting part 600 may convert the amplitude of the laser beam 10 that irradiates the substrate 20. That is, the beam-transmitting part 600 may be disposed below the third reflecting mirror 530 to convert the amplitude of the laser beam 10 that is reflected by the third reflecting mirror 530.

In this embodiment, the beam-transmitting part 600 may decrease the amplitude of the laser beam 10. For example, the beam-transmitting part 600 may decrease the amplitude of the laser beam 10 by about ⅕.

The transferring means 700 may support the substrate 20, and may transfer the substrate 20 up-and-down and right-and-left directions. That is, the mask 400 may be fixed, and the substrate 20 may be moved by the transferring means 700. Alternatively, the substrate 20 may be fixed, and the mask 400 may be moved.

As the mask 400 is relatively moved in up-and-down and right-and-left directions with respect to the substrate 20, the laser beam 10 transmitted through the up-and-down and right-and-left directions 400 may irradiated the entire area of the substrate 20, so that the entire semiconductor layer may be converted into the polycrystalline silicon.

Figure 2:
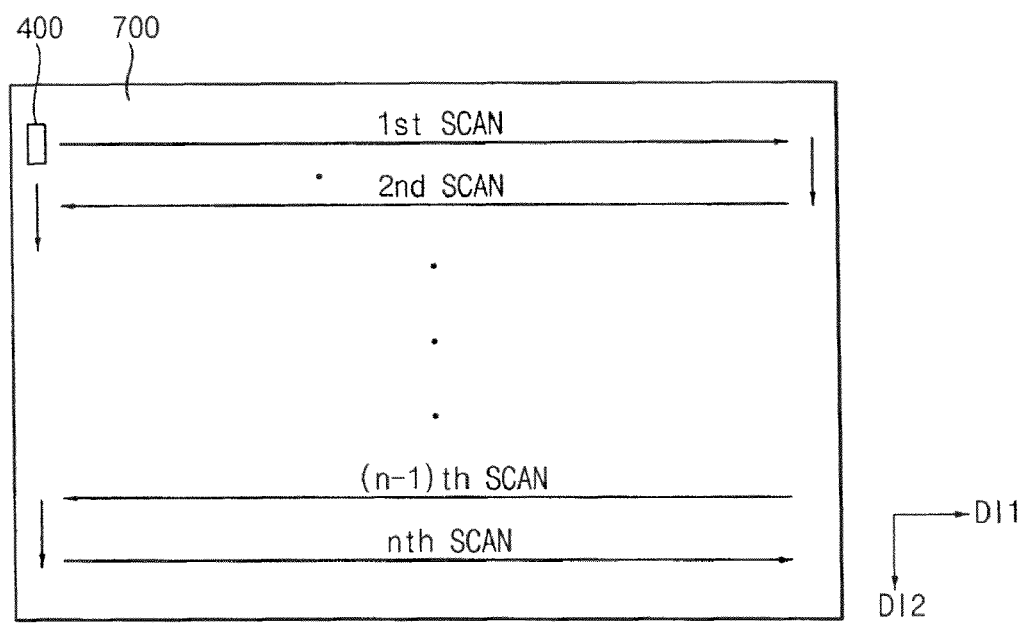
FIG. 2 is a plan view illustrating an exemplary embodiment of a process in which crystallization of a semiconductor layer is enhanced by a semiconductor layer crystallization apparatus of FIG. 1.
Figure 3:
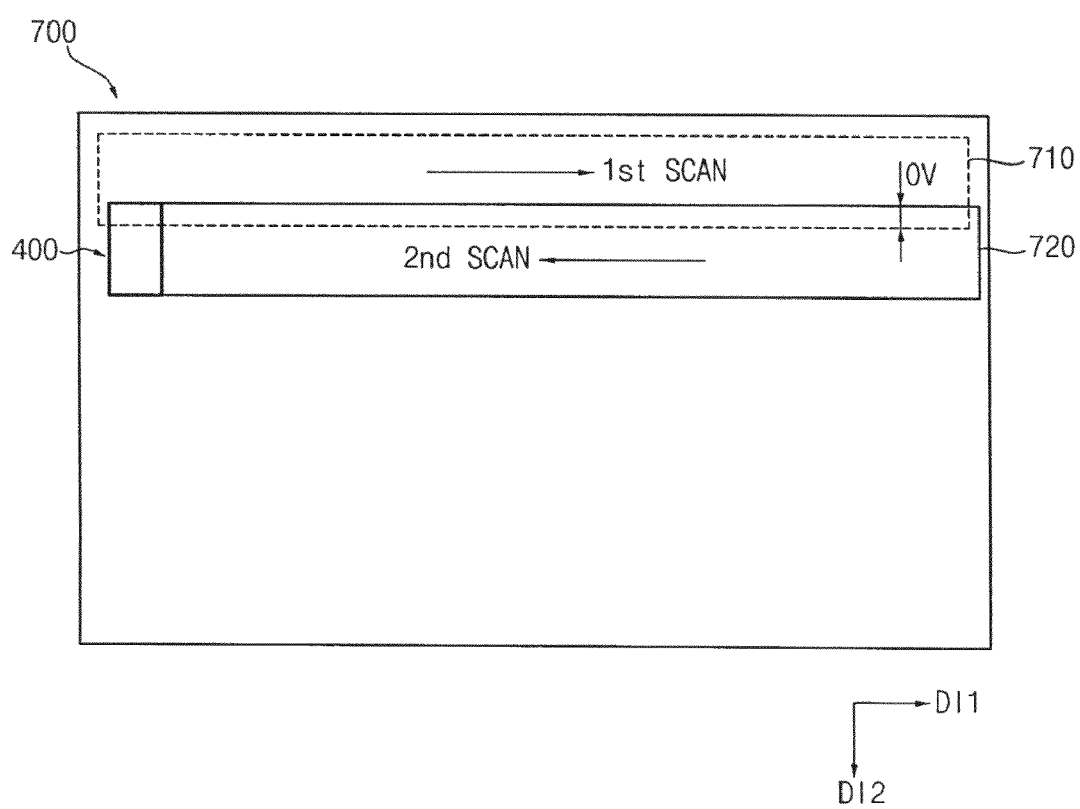
FIG. 3 is a plan view of an exemplary embodiment illustrating a relationship between a first area and a second area where a laser beam is irradiated at FIG. 2.

FIG. 2 is a plan view illustrating an exemplary process in which crystallization of a semiconductor layer is enhanced by a semiconductor layer crystallization apparatus of FIG. 1. FIG. 3 is a plan view illustrating, in an exemplary embodiment, a relationship between a first area and a second area where a laser beam irradiates at FIG. 2.

Referring to FIGS. 2 and 3, an exemplary embodiment of a method of crystallizing a semiconductor layer will be described.

First, the mask 400 may be disposed on the substrate 20 having the semiconductor layer formed thereon. For example, the mask 400 may be disposed in an area corresponding to a left and upper portion of the substrate 20. Here, disposing the mask 400 at a position corresponding to a left and upper portion of the substrate 20 denotes that a position of the mask 400 or the substrate 20 is adjusted in order to be irradiated the laser beam 10 transmitted through the mask 400 to the left and upper portion of the substrate 20.

Then, the mask is intermittently moved along a first direction DI1 with respect to the substrate 20. That is, the mask 400 may be intermittently moved to a position corresponding to a right and upper position of the substrate 20.

When the mask 400 is moved, the laser beam 10 is transmitted through the mask 400 to intermittently irradiate a first area 710 of the substrate 20. That is, a first scanning (1st SCAN) is performed. Thus, a portion of the semiconductor layer corresponding to the first area 710 may be crystallized into the polycrystalline silicon.

After the first scanning (1st SCAN) is performed, the mask 400 may be moved by a vertical moving distance along a second direction DI2 perpendicular to the first direction DI1 with respect to the substrate 20. The vertical moving distance may be equal to or less than a length of the second direction of the mask 400.

Then, the mask 400 may be intermittently moved along an inversion direction of the first direction DI1 with respect to the substrate 20. That is, the mask 400 may be intermittently moved at a position corresponding to a left edge portion of the substrate 20 when viewed on a plan view.

When the mask 400 is moved, the laser beam 10 is transmitted through the mask 400 to intermittently irradiate a second area 720 of the substrate 20. That is, a second scanning (2nd SCAN) is performed. Thus, a portion of the semiconductor layer corresponding to the second area 720 may be crystallized into the polycrystalline silicon.

The first and second areas 710 and 720 may overlap each other. A width OV of an overlapping area between the first and second areas 710 and 720 has a range of 3 µm to about 8 µm. For example, the width OV of the overlapping area may be about 5 µm.

After the second scanning (2nd SCAN) is performed, the mask 400 may be moved by the vertical moving distance along the second direction DI2 with respect to the substrate 20.

Accordingly, the laser beam 10 transmitted through the mask 400 is moved N times in the left side and right side of the substrate 20 repeatedly, thereby performing an (N)-th scanning (n-th SCAN). As the (N)-th scanning (n-th SCAN) is finished, the laser beam 10 transmitted through the mask 400 may have irradiated the entire area of the substrate 20, so that crystallization of the semiconductor layer formed on the substrate 20 may be enhanced to be converted into polycrystalline silicon.

Figure 4:
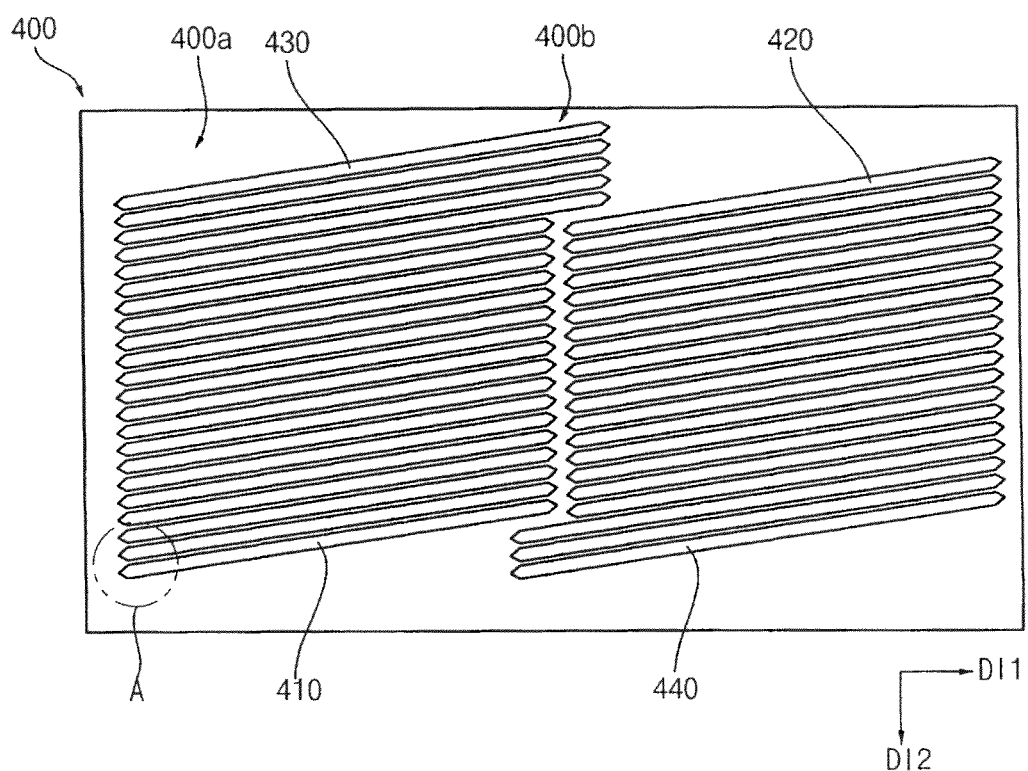
FIGS. 4 and 5 are plan views illustrating an exemplary embodiment of a mask for crystallizing a semiconductor layer of the semiconductor layer crystallization apparatus of FIG. 1.
Figure 5:
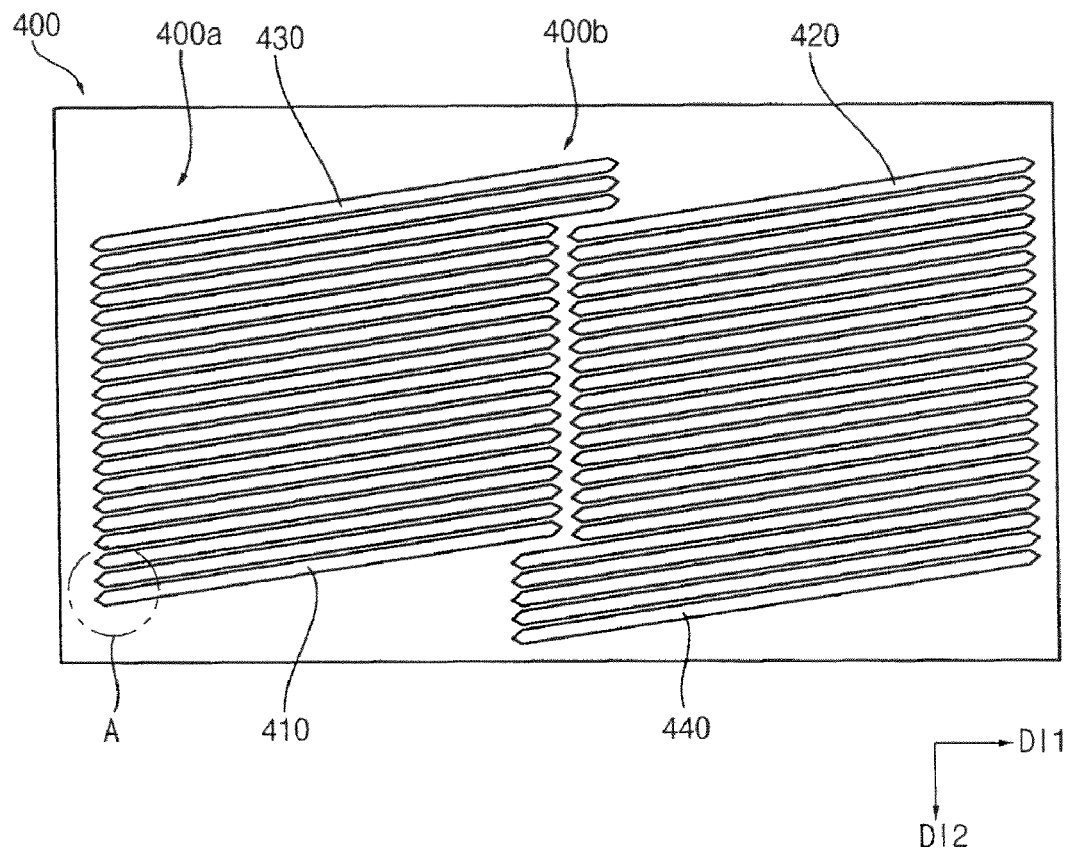
Figure 6:
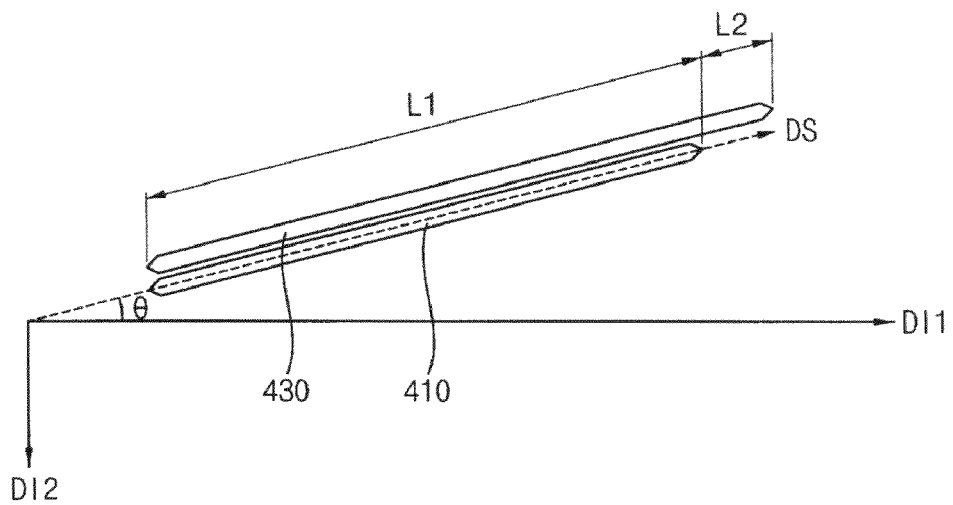
FIG. 6 is a plan view of an exemplary embodiment illustrating a relationship between a first main-slit portion and an upper slit portion of the mask for crystallizing a semiconductor layer of FIG. 4.

FIGS. 4 and 5 are plan views illustrating an exemplary embodiment of a mask for crystallizing a semiconductor layer of the semiconductor layer crystallization apparatus of FIG. 1. FIG. 6 is a plan view illustrating, in an exemplary embodiment, a relationship between a first main-slit portion and an upper slit portion of the mask of FIG. 4.

Referring to FIGS. 4 and 6, in an exemplary embodiment, the mask 400 may include a light-blocking portion 400a blocking the laser beam 20 and a light-transmitting portion 400b transmitting the laser beam 10, when viewed on a plan view. For example, a size of the mask 400 may be about 125 mm×6 mm.

The light-blocking portion 400a may include a metal material such as chromium (Cr), which blocks the laser beam 10.

The light-transmitting portion 400b represents a portion where the light-blocking portion 400b is not formed. The light-transmitting portion 410 may include a plurality of main slit portions disposed in parallel with each other and at least one of extended slit portion having a longer length than that of the main slit portions about 8% to about 12%. The extended slit portion being disposed in parallel with the main slit portions. An imaginary line connecting a plurality of end portions of the main slit portions is not met with an imaginary line connecting a plurality of end portions of the upper slit potions.

The main slit portions may include a plurality of first main-slit portions 410 and a plurality of second main-slit portions 420. The extended slit potion may include at least one upper slit portion 430 and at least one lower slit portion 440.

The first main-slit portions 410 may extend in an inclined direction DS that is inclined at a predetermined angle with respect to the first direction DI1, and are disposed along the second direction DI2.

An angle "θ" between the first direction DI1 and the inclined direction DS may have a range of about 0.1 degrees to about 30 degrees. A length L1 of the first main-slit portions 410 may have a range of about 2,700 µm to about 3,300 µm. For example, a length L1 of the first main-slit portions 410 may be about 3,000 µm. The number of the first main-slit portions 410 may have a range of about 3,000 to about 4,000. For example, the number of the first main-slit portions 410 may be about 3,500.

The second main-slit portions 420 may be spaced apart from the first main-slit portions 410 in the first direction DI1. The second main-slit portions 420 may be extended in the inclined direction DS, and may be disposed substantially in parallel along the second direction DI2.

A length of the second main-slit portions 420 may be substantially equal to a length L1 of the first main-slit portions 410. That is, the length of the second main-slit portions 420 may have a range of about 2,700 µm to about 3,000 µm. For example, the length of the second main-slit portions 420 may be about 3,000 µm. The number of the second main-slit portions 420 may be substantially equal to that of the first main-slit portions 410. That is, the number of the second main-slit portions 420 may have a range of about 3,000 to about 4,000. For example, the number of the second main-slit portions 420 may be about 3,500.

The second main-slit portions 420 may be disposed between the first main-slit portions 410. That is, the second main-slit portions 420 may not be disposed on imaginary lines that extend along the inclined direction DS from the first main-slit portions 410, but may be disposed between the imaginary lines. For example, the second main-slit portions 420 may be disposed at a position corresponding to a center between the first main-slit portions, that is, a center of the imaginary lines.

At least one of the upper slit portions 430 may be disposed adjacent to a slit portion disposed at the uppermost side of the first main-slit portions 410. The upper slit portion 430 extends in the inclined direction DS parallel to the first main-slit portions 410. There may be more than one upper slit portion 430. For example, there may be five upper slit portions 430. The plurality of the upper slit portions 430 may be disposed along the second direction DI2 parallel to each other. In an area where the first main slit portions 410 and the second main slit portions 420 are face each other, an imaginary line (not shown) connecting a plurality of end portions of the first main slit portions 410 is not met with an imaginary line (not shown) connecting a plurality of end portions of the upper slit potions 430.

The upper slit portion 430 may extend by an extending length L2 beyond the first main-slit portions 410 in a direction toward the second main-slit portions 420. That is, a left terminal of the upper slit portion 430 may correspond to a left terminal of the first main-slit portions 410, and a right terminal of the upper slit portion 430 may be spaced apart from a right terminal of the first main-slit portions 410 by the extending length L2 in the direction of the inclined direction DS.

The extending length L2 may have a range of about 50 µm to about 100 µm. Moreover, the extending length L2 may have a range of about 8% to about 12% of a length L1 of the first main-slit portions 410. When the extending length L2 is no more than about 5% of a length L1 of the first main-slit portions 410, an irradiating area corresponding to a right edge portion of a second left irradiating area may be not overlapped with an irradiating area corresponding to a left edge portion of a first left irradiating area due to an accuracy of a stage moving a substrate. Alternatively, when the extending length L2 is no less than about 12% of a length L1 of the first main-slit portions 410, one portion of a semiconductor layer may be crystallized in a non-uniformity so that a spot may be generated. For example, the extending length L2 may be about 10% of a length L1 of the first main-slit portions 410.

At least one of the lower slit portions 440 may be disposed adjacent to a slit portion disposed at the lowermost side of the second main-slit portions 420. The lower slit portion 440 may extend in the inclined direction DS parallel to the second main-slit portions 420. The number of the lower slit portions 440 may be plural. For example, the number of the lower slit portions 440 may be three. The plurality of the lower slit portions 440 may be disposed along the second direction DI2 in parallel with each other.

The lower slit portion 440 may extend by an extending length L2 beyond the second main-slit portions 420 in a direction toward the first main-slit portions 410. That is, a right terminal of the lower slit portion 440 corresponds to a right terminal of the second main-slit portions 420, and a left terminal of the lower slit portion 440 is spaced apart from a left terminal of the second main-slit portions 420 by the extending length L2 along the inclined direction DS. Thus, a length of the upper slit portion 430 may be substantially equal to that of the lower slit portions 440. That is, in an area where the first main slit portions 410 and the second main slit portions 420 are face each other, an imaginary line (not shown) connecting a plurality of end portions of the second main slit portions 420 is not met with an imaginary line (not shown) connecting a plurality of end portions of the lower slit potions 440.

Alternatively, the number of the upper slit portions 430 may be greater than the number of lower slit portions 440. For example, the number of upper slit portions 430 may be two more than the number of lower slit portions 440.

Moreover, the number of the upper slit portions 430 and the number of the lower slit portions 440 may be substantially proportional to an angle "θ" between the first direction DI1 and the inclined direction DS. That is, when the angle "θ" between the first direction DI1 and the inclined direction DS is increased, the number of the upper slit portions 430 and the number of the lower slit portions 440 may be substantially increased with an equal ratio.

When an angle "θ" between the first direction DI1 and the inclined direction DS is 2N degrees, the number of the lower slit portions 440 may be 3N (wherein 'N' is a natural number) and the number of the upper slit portions 440 may be 3N+2. For example, when the angle "θ" between the first direction DI1 and the inclined direction DS is about 2 degrees, the number of the lower slit portions 440 may be three and the number of the upper slit portions 440 may be five. Moreover, when the angle "θ" between the first direction DI1 and the inclined direction DS is about 4 degrees, the number of the lower slit portions 440 may be six and the number of the upper slit portions 440 may be eight.

In an exemplary embodiment, the number of upper slit portions 430 may be greater than the number of lower slit portions 440. Alternatively, the number of the lower slit portions 440 may be greater than the number of upper slit portions 430 as described in FIG. 5. For example, the number of the lower slit portions 440 may be two more than the number of the upper slit portions 430.

Figure 7:
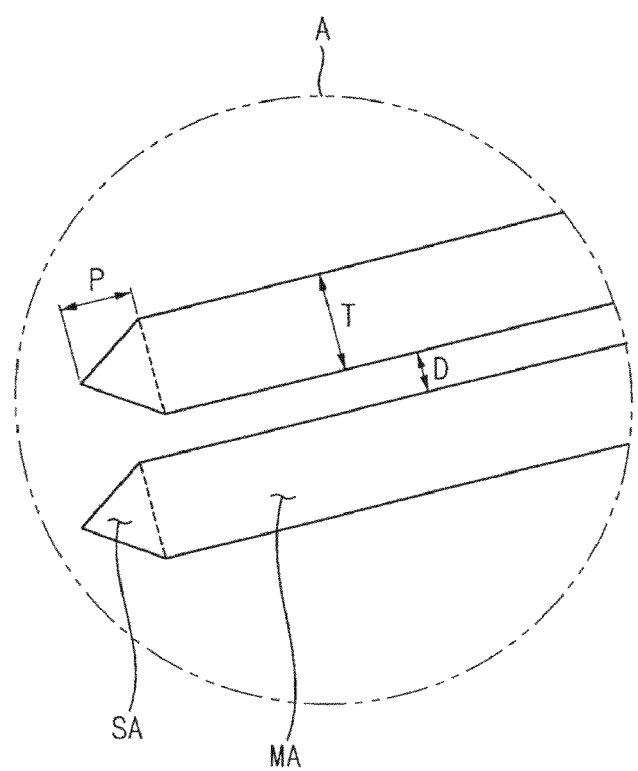
FIG. 7 is an enlarged plan view illustrating an exemplary embodiment of a portion 'A' of FIG. 4.

FIG. 7 is an enlarged plan view illustrating a portion 'A' of FIG. 4.

Referring to FIG. 7, each of the first main-slit portions 410, the second main-slit portions 420, the upper slit portions 430 and the lower slit portions 440 may have a main-opening portion MA and a couple of sub-opening portions SA.

The main-opening portion MA may correspond to the entire area of each slit portion. Each of the sub-opening portions SA may be formed at two ends of the main-opening portion MA, respectively. The sub-opening portion SA may have a shape such that an amount of the laser beam 10 transmitted through the sub-opening portion SA decreases with increasing distance from the main-opening portion MA. For example, the sub-opening portion SA may have a shape of a triangle (e.g., an isosceles triangle).

The main-opening portion MA may be about 2,700 μm to about 3,300 μm long. For example, the length of the main-opening portion MA may be about 3,000 μm. A width "T" of the main-opening portion MA may have a range of about 25 μm to about 35 μ. For example, the width "T" may be about 27.5 μm. An interval distance "D" between the main-opening portions MA may have a range of about 2.5 μm to about 10 μm. For example, the interval distance "D" may be about 7.5 μm. An extruding height "P" of the sub-opening portion SA may have a range of about 3 μm to about 8 μm. For example, the extruding height "P" may be about 5.5 μm.

As described above, in the present embodiment, the first slit portions 410, the second main-slit portions 420, the upper slit portion 430 and the lower slit portion 440 may have a substantially equal width.

Moreover, an interval distance between the first main-slit portions 410, an interval distance between the second main-slit portions 420, an interval distance between a slit portion disposed at the uppermost side of the first main-slit portion 410 and the upper slit portion 430, and an interval distance between a slit portion disposed at the lowermost side of the second main-slit portion 420 and the lower slit portion 440 are substantially spaced apart from each other.

Figure 8:
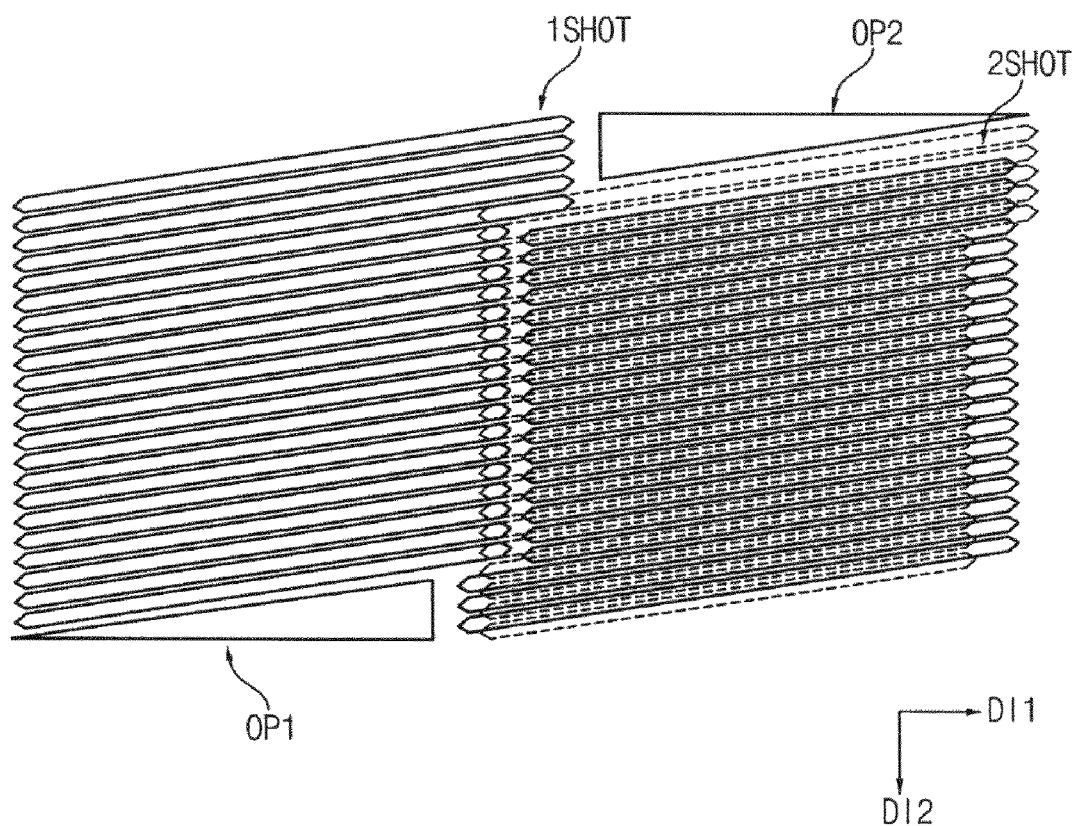
FIG. 8 is a plan view of an exemplary embodiment illustrating a relationship between a first irradiation area and a second irradiation area of a laser beam that transmits the mask for crystallizing a semiconductor layer of FIG. 4.
Figure 9:
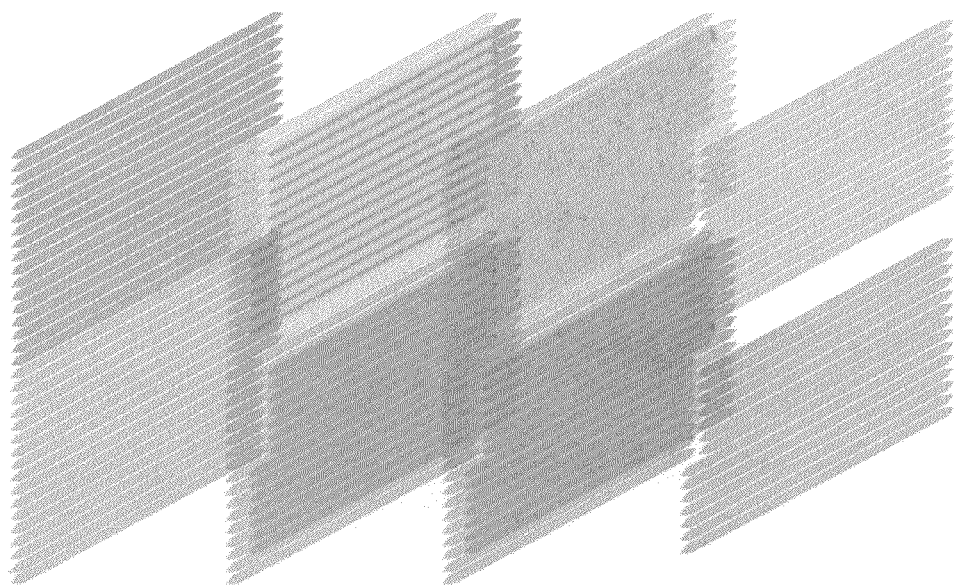
FIG. 9 is a plan view illustrating an exemplary embodiment of a status in which the first and second opening areas are removed of FIG. 8.

FIG. 8 is a plan view of an exemplary embodiment illustrating a relationship between a first irradiation area and a second irradiation area of a laser beam that transmits the mask of FIG. 4. FIG. 9 is a plan view of an exemplary embodiment illustrating a status in which the first and second opening areas are removed of FIG. 8.

Referring to FIGS. 2, 3, 8, and 9, the laser beam 10 transmitted through the mask 400 may irradiate first irradiation areas 1SHOT of the substrate 20 to enhance crystallinity of one portion of the semiconductor layer. The first irradiation area 1SHOT may include a first left irradiation area corresponding to the first main-slit portions 410 and the upper slit portion 430, and a first right irradiation area corresponding to the second main-slit portions 420 and the lower slit portion 440.

Then, the mask 400 may then be moved by a horizontal moving distance along the second direction DI2 with respect to the substrate 20, and the laser beam 10 transmitted through the mask 400 may irradiate a second irradiation area 2SHOT of the substrate 20 to enhance crystallinity of another portion of the semiconductor layer. The second irradiation area 2SHOT may include a second left irradiation area corresponding to the first main-slit portions 410 and the upper slit portion 430, and a second right irradiation area corresponding to the second main-slit portions 420 and the lower slit portion 440. The second right irradiation area 2SHOT is not shown in FIG. 7.

The horizontal moving distance may be equal to smaller than a length component toward the first direction DI1 corresponding to a length of the first main-slit portions 410. That is, a right edge portion of the second left irradiation area may be overlapped with a left edge portion of the first left irradiation area. Here, a width of an overlapping area between the first and second irradiation areas 1SHOT and 2SHOT may have a range of about 1 μm to about 100 μm. For example, an irradiation area corresponding to the sub-opening portion SA of the second left irradiation area may be overlapped with an irradiation area corresponding to the sub-opening portion SA of the first left irradiation area.

Moreover, the second left irradiation area may be formed between the first right irradiation areas. The second left irradiation area may be overlapped with a portion of the first right irradiation area.

As described, by repeatedly forming first and second irradiation areas 1SHOT and 2SHOT along the first direction DI1 or an opposite direction of the first direction D1, the entire area of the substrate 20 may be converted into the polycrystalline silicon so that crystallization may be enhanced.

In an exemplary embodiment, in which slit portions are formed to be inclined with respect to the first direction DI1, a boundary surface or a protrusion of the polycrystalline silicon is also formed to be inclined with respect to the first direction DI1. When the boundary surface or the protrusion of the polycrystalline silicon is formed to be inclined with respect to the first direction DI1, electrical characteristics of the TFT manufactured by using the polycrystalline silicon may be enhanced.

After the first and second irradiation areas 1SHOT and 2SHOT are formed, a first opening area OP1 is formed at a lower portion of the first left irradiation area and a second opening area OP2 is formed at an upper portion of the first right irradiation area. The first and second opening areas OP1 and OP2 denote areas where the laser beam did not irradiate the substrate, as the slit portions are formed to be inclined with respect to the first direction DI1.

When a size of a width OV of an opening area between the first and second areas 710 and 720 is increased in FIG. 3, the first and second opening areas OP1 and OP2 may be removed. However, when a size of a width OV of the opening area between the first and second areas 710 and 720 is greatly increased, electrical characteristics of the polycrystalline silicon may be decreased, since electrical characteristics of polycrystalline silicon at an area where the laser beam irradiated the substrate twice is different from an area of polycrystalline silicon where the laser beam irradiated the substrate once.

In the present embodiment, the upper slit portions 430 may be formed at an upper side of the first main-slit portions 410 parallel to the first main-slit portions 410, and may be extended longer than the first main-slit portions 410 toward the second main-slit portions 420. Moreover, the lower slit portion 440 may be formed at a lower side of the second main-slit portions 420 parallel to the second main-slit portions 420, and may be extended longer than the second main-slit portions 420 toward the first main-slit portions 410.

As described above, as the upper slit portion 430 extends longer than the first main slit portions 410 and the lower slit portion 440 extends longer than the second main slit portions 420, a width OV of an overlapping area between the first and second areas 710 and 720 may be minimized and the first and second opening areas OP1 and OP2 may be removed. That is, crystallization of the semiconductor layer may be enhanced in the first and second opening areas OP1 and OP2 as shown in FIG. 9.

In an exemplary embodiment, a width OV of an overlapping area between the first and second area 710 and 720 may have a range of about 3 μm to about 8 μm. For example, the width OV may be about 5 μm. When the number of the upper slit portions 430 is different from that of the lower slit portions 440, the first and second areas 710 and 720 may be connected to not be overlapped with each other. That is, the width OV of the opening area between the first and second areas 710 and 720 may be about 0 μm.

Accordingly, when crystallization of the entire area of the substrate 20 is enhanced by using the mask 400, a width OV of an overlapping area between the first and second areas 710 and 720 may be minimized and crystallization of the polycrystalline silicon may be enhanced in the entire area of the substrate 20. Therefore, electrical characteristics of the polycrystalline silicon formed on the substrate 20 may be enhanced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A mask for crystallizing a semiconductor layer, the mask comprising:

a plurality of first main-slit portions extending along an inclined direction with respect to a first direction, the first main-slit portions being disposed substantially parallel to one another and along a second direction substantially perpendicular to the first direction;

a plurality of second main-slit portions being spaced apart from the first main-slit portions in the first direction, the second main-slit portions extending along the inclined direction with the same length as the first main-slit portions and disposed substantially parallel to one another and along the second direction;

at least one upper slit portion disposed substantially parallel to and above the first main-slit portions along the second direction, the upper slit portions extending toward the second main-slit portions to be longer than the first main-slit portions; and at least one lower slit portion disposed substantially parallel to and under the second main-slit portions along the second direction, the lower slit portions extending toward the first main-slit portions to be longer than the second main-slit portions.

2. The mask of claim 1, wherein the number of the upper slit portions is greater than the number of the lower slit portions.

3. The mask of claim 2, wherein the number of the upper slit portions is two more than that of the lower slit portions.

4. The mask of claim 2, wherein the number of the upper slit portions is substantially proportional to an angle between the first direction and the inclined direction.

5. The mask of claim 4, wherein the number of the upper slit portions is 3N (wherein 'N' is a natural number) and the angle between the first direction and the inclined direction is 2N degrees.

6. The mask of claim 1, wherein the number of lower slit portions is greater than the number of the upper slit portions.

7. The mask of claim 6, wherein the number of lower slit portions is two more than that of the lower slit portions.

8. The mask of claim 6, wherein the number of the upper slit portions is substantially proportional to an angle between the first direction and the inclined direction.

9. The mask of claim 8, wherein the number of the upper slit portions is 3N (wherein 'N' is a natural number) when the angle between the first direction and the inclined direction is 2N degrees.

10. The mask of claim 1, wherein a length of the at least one upper slit portion is substantially equal to a length of the lower slit portions.

11. The mask of claim 10, wherein the at least one upper slit portion extends toward the second main-slip portions about 8% to about 12% beyond the first main-slit portions.

12. The mask of claim 1, wherein an extension of each imaginary center line of the second main-slit portions is disposed between the adjacent at least two first main-slit portions.

13. The mask of claim 1, wherein the number of the first main-slit portions is equal to the number of the second main-slit portions.

14. The mask of claim 13, wherein the first main-slit portions, the second main-slit portions, the upper slit portion and the lower slit portion have an equal width substantially equal with each other.

15. The mask of claim 13, wherein an interval distance between the first main-slit portions, an interval distance between the second main-slit portions, an interval distance between a slit portion disposed at the uppermost side of the first main-slit portion and the upper slit portion, and an interval distance between a slit portion disposed at the lowermost side of the second main-slit portion and the lower slit portion are substantially equal.

16. The mask of claim 1, wherein an imaginary line connecting a plurality of end portions of the first main slit portions is not met with an imaginary line connecting a plurality of end portions of the upper slit potions.

17. A mask for crystallizing a semiconductor layer, the mask comprising:
- a plurality of main slit portions disposed in parallel with each other; and
- at least one of extended slit portion having a longer length than that of the main slit portions, the extended slit portion being disposed in parallel with the main slit portions,
- wherein an imaginary line connecting a plurality of end portions of the main slit portions is not met with an imaginary line connecting a plurality of end portions of the upper slit potions.

18. The mask of claim 17, wherein the extended slit portion is formed on at least one of an upper portion of the main slit portion and a lower portion of the main slit portion, when viewed on a plan view.

19. The mask of claim 18, wherein the main and the extended slit portions are inclined along an inclined direction with respect to a first direction in parallel with an edge portion of the mask.

20. The mask of claim 19, wherein the number of the extended slit portion formed on the upper portion of the main slit portion is greater than the number of the extended slit portion formed below the lower portion of the main slit portion.

21. The mask of claim 19, wherein the number of the extended slit portion is substantially proportional to an angle between the first direction and the inclined direction.

22. The mask of claim 19, wherein the number of the upper slit portions is 3N (wherein 'N' is a natural number) and the angle between the first direction and the inclined direction is 2N degrees.

23. The mask of claim 17, wherein the extended slit portion has a longer length than that of the main slit portions about 8% to about 12%.

* * * * *